US011754782B2

(12) United States Patent
Hannan

(10) Patent No.: US 11,754,782 B2
(45) Date of Patent: Sep. 12, 2023

(54) MECHANICALLY HELD POLYMER LENSES FOR PHOTONICS DEVICE MAINTAINING PLACEMENT REFERENCE TO DIE

(71) Applicant: STMicroelectronics (Research & Development) Limited, Marlow (GB)

(72) Inventor: Joseph Hannan, Helsinki (FI)

(73) Assignee: STMicroelectronics (Research & Development) Limited, Marlow (GB)

( * ) Notice: Subject to any disclaimer, the term of this patent is extended or adjusted under 35 U.S.C. 154(b) by 89 days.

(21) Appl. No.: 17/313,301

(22) Filed: May 6, 2021

(65) Prior Publication Data

US 2022/0357507 A1 Nov. 10, 2022

(51) Int. Cl.
*G02B 6/122* (2006.01)
*H05K 1/02* (2006.01)
*G02B 6/12* (2006.01)

(52) U.S. Cl.
CPC .......... *G02B 6/122* (2013.01); *H05K 1/0274* (2013.01); *G02B 2006/1213* (2013.01); *G02B 2006/12102* (2013.01); *G02B 2006/12109* (2013.01); *H05K 2201/10121* (2013.01)

(58) Field of Classification Search
CPC .......... G02B 2006/12102; G02B 2006/12109; G02B 2006/1213; G02B 6/122; H05K 1/0274; H05K 2201/10121
See application file for complete search history.

(56) References Cited

U.S. PATENT DOCUMENTS

| 11,385,423 | B2* | 7/2022 | Carley | G02B 6/424 |
| 2005/0094293 | A1* | 5/2005 | Tanabe | G02B 7/14 |
| | | | | 359/811 |
| 2005/0141106 | A1* | 6/2005 | Lee | G02B 7/023 |
| | | | | 359/808 |
| 2017/0126938 | A1* | 5/2017 | Newiger | B60R 1/00 |
| 2020/0310227 | A1* | 10/2020 | Hubert | G02B 7/008 |
| 2020/0384287 | A1* | 12/2020 | Hetz | A61B 18/22 |
| 2022/0357507 | A1* | 11/2022 | Hannan | H05K 1/0274 |

FOREIGN PATENT DOCUMENTS

| CN | 114347896 | A | * | 4/2022 | |
| JP | 2013077768 | A | * | 4/2013 | |
| JP | 2020095217 | A | * | 6/2020 | |
| WO | WO-2017017589 | A1 | * | 2/2017 | G02B 7/022 |

* cited by examiner

*Primary Examiner* — Thomas A Hollweg
*Assistant Examiner* — Mary A El-Shammaa
(74) *Attorney, Agent, or Firm* — CROWE & DUNLEVY

(57) ABSTRACT

A photonic device includes a PCB having an integrated circuit mounted thereon, with a cap mounted to the PCB and carrying a lens positioned over the integrated circuit. The cap is formed by: an outer wall mounted to the PCB, extending upwardly from the PCB, and surrounding a portion of the integrated circuit; a first retention structure extending inwardly from the outer wall and across the integrated circuit, the first retention structure having a hole defined therein; and a second retention structure having a hole defined therein, the second retention structure being affixed within the first retention structure such that the hole in the second retention structure is axially aligned with the hole in the first retention structure. The lens is mechanically constrained within the cap between the first retention structure and the second retention structure.

20 Claims, 5 Drawing Sheets

MECHANICALLY HELD POLYMER LENSES FOR PHOTONICS DEVICE MAINTAINING PLACEMENT REFERENCE TO DIE

TECHNICAL FIELD

This disclosure is related to the field of photonics and, in particular, to a cap for securely holding a lens in place over an integrated circuit die, the secure holding being accomplished mechanically.

BACKGROUND

In the field of photonics, a lens (or multiple stacked lenses) is held over its respective associated light sensor or emitter by a cap. During device fabrication, the cap is first affixed using glue to a printed circuit board (PCB) carrying the associated light sensor or emitter. The lenses can then by affixed to the cap while using the associated light sensor or emitter as a placement reference, therefore ensuring best optical alignment of the photonics device.

Such photonics devices may be incorporated within portable electronics devices, and such portable electronics devices may be subjected to varying temperatures and environments in the course of operation. For example, such a portable electronic device may experience extended periods in an elevated temperature and high humidity environment. This may have the effect of weakening the adhesion between the glue and the lens, and can be of particular concern if the starting adhesion strength immediately after manufacture is low. For example adhesion to polycarbonate based lens materials is often poor. When the adhesion between the glue and the lens is in a weakened state, the lens may become detached if the portable electronic device is subjected to mechanical stresses (e.g., is dropped by the user), rendering the photonics device unusable or inaccurate.

Since this is clearly undesirable, new geometrical structures and techniques for affixing lenses within their associated caps are desired so as to enable the production of photonics devices that are more robust and durable.

SUMMARY

Disclosed herein is a photonic device, including: a printed circuit board (PCB) having an integrated circuit mounted thereon; and a cap mounted to the PCB and carrying a lens positioned over the integrated circuit. The cap has: an outer wall mounted to the PCB, extending upwardly from the PCB, and surrounding at least a portion of the integrated circuit; a first retention structure extending inwardly from the outer wall and across the integrated circuit, the first retention structure having a hole defined therein; and a second retention structure having a hole defined therein, the second retention structure being affixed within the first retention structure such that the hole in the second retention structure is axially aligned with the hole in the first retention structure, with the lens being mechanically constrained within the cap between the first retention structure and the second retention structure, with light being transmissible therethrough via the hole defined in the second retention structure, the mechanical constraint of the lens being such to align the lens with the integrated circuit.

The outer wall and first retention structure may be integrally formed as a monolithic unit.

The first retention structure may include a shelf extending orthogonally from respective parts of the outer wall and a support extending from a distal end of the shelf and orthogonally thereto in a direction away from the PCB. The lens may be mechanically constrained between a bottom face of the second retention structure and the support of the first retention structure.

The second retention structure may include a shaped wall (e.g., ring shaped) extending parallel to the outer wall, with a ceiling extending across the shaped wall, the ceiling having the hole defined therein.

The outer wall may surround three sides of the integrated circuit. The cap may also include an inner wall extending between two portions of the outer wall such that the inner wall extends along a fourth side of the integrated circuit, with a first portion of the first retention structure extending from the outer wall and across the integrated circuit. A second portion of the first retention structure may extend from the interior wall and across the integrated circuit.

The first and second portions of the first retention structure may define a shelf, and a support may extend from a distal end of the shelf and orthogonally thereto in a direction away from the PCB. The lens may be mechanically constrained between a bottom face of the second retention structure and the support of the first retention structure.

The PCB may have an additional integrated circuit mounted thereon. The outer wall may surround three sides of the additional integrated circuit, and the inner wall may extend between two portion of the outer wall such that the inner wall extends along a fourth side of the additional integrated circuit. A third portion of the first retention structure may extend outwardly from the outer wall and across the additional integrated circuit. A fourth portion of the first retention structure may extend outwardly from the interior wall and across the additional integrated circuit.

The third and fourth portions of the first retention structure may define an additional shelf, and an additional support may extend from a distal end of the additional shelf and orthogonally thereto in a direction away from the PCB. An additional lens may be mechanically constrained between a bottom face of the second retention structure and the additional support of the first retention structure.

A first filter may be glued to a bottom face of the shelf, and a second filter may be glued to a bottom faces of the additional shelf.

The third and fourth portions of the first retention structure may define an additional shelf, and an additional support may extend from a distal end of the additional shelf and orthogonally thereto in a direction away from the PCB. An additional lens may be sized so as to be press fit and mechanically constrained between the outer wall and the inner wall, supported by the additional support of the first retention structure.

The cap may also include a hardened mass in contact with a perimeter of the additional lens and with the outer wall and inner wall.

The additional lens may have a chamfer defined therein, and the hardened mass may be in contact with a surface of the chamfer.

Portions of the outer wall and inner wall adjacent the second lens may be trapezoidally shaped at distal ends thereof.

A filter may be glued to a bottom face of the first retention structure.

The filter may be formed of glass, and the lens may be formed of polycarbonate.

Also disclosed herein is a method of forming the photonic device, the method including: mounting an integrated circuit on an printed circuit board (PCB); affixing a cap to the PCB over the integrated circuit, the cap having an outer wall mounted to the substrate, extending upwardly from the substrate, and surrounding at least a portion of the integrated circuit, and a first retention structure extending inwardly from the outer wall and across the integrated circuit; press fitting a lens into a second retention structure of the cap; and positioning the second retention structure such that the lens is aligned with the integrated circuit, and gluing the second retention structure to the first retention structure such that the lens is mechanically constrained within the cap between the first retention structure and the second retention structure.

The method may also include mounting an additional integrated circuit on the PCB, and press fitting an additional lens between the outer wall of the cap and an interior wall of the cap, prior to affixing the cap to the PCB.

The method may also include applying a hardenable substance about a perimeter of the additional lens, and in contact with the outer wall and interior wall, such that when the hardenable substance hardens, the additional lens is mechanically constrained between a first portion of the first retention structure extending from the outer wall across the additional integrated circuit, a second portion of the first retention structure extending from the interior wall, and the hardened substance.

The method may also include gluing a filter to a bottom face of the first retention structure, prior to affixing the cap to the PCB.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
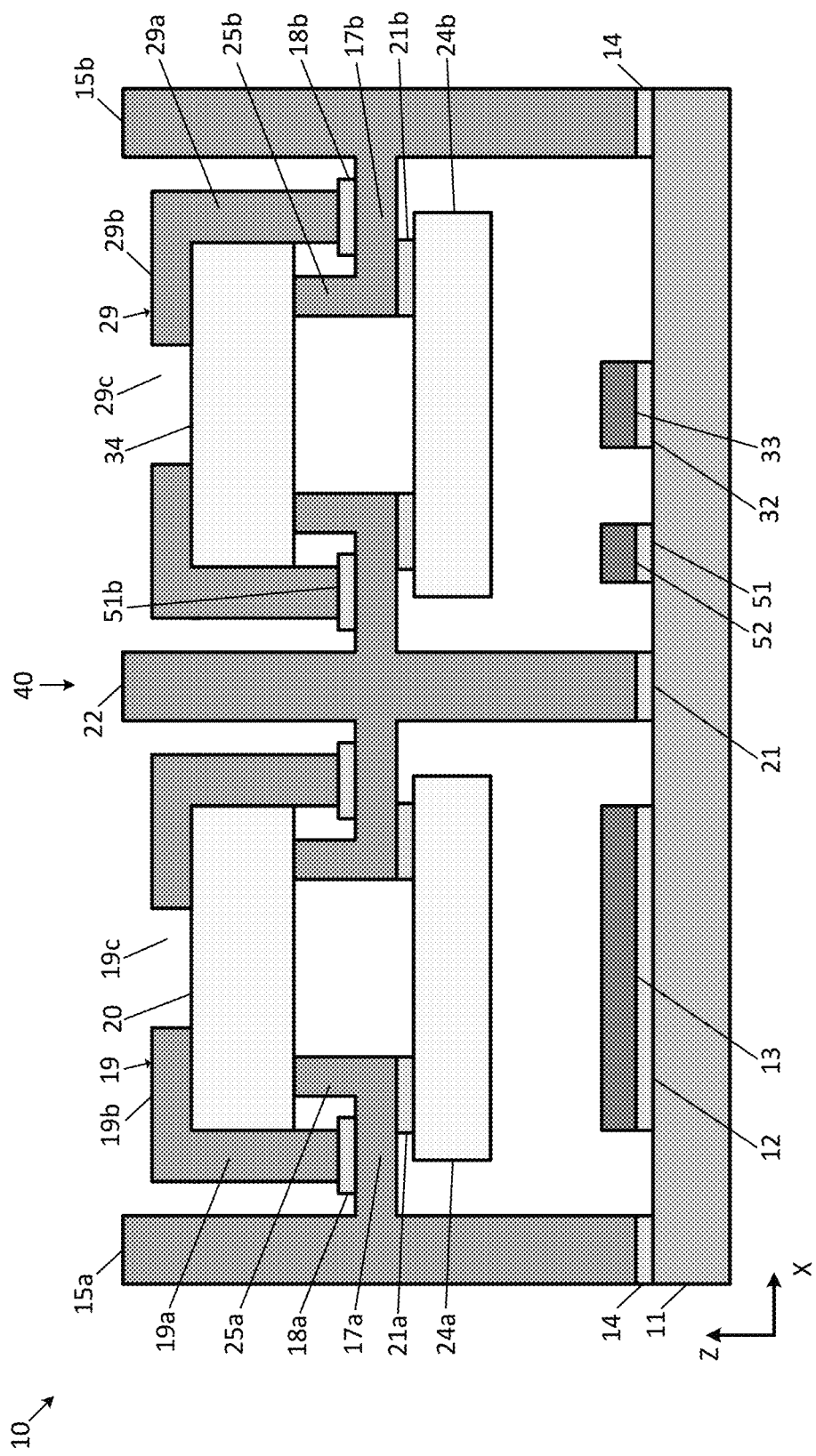
FIG. 1 is a diagrammatical view of a cross section of a photonic device disclosed herein, in which the lenses are mechanically captured within the cap.
Figure 2B:
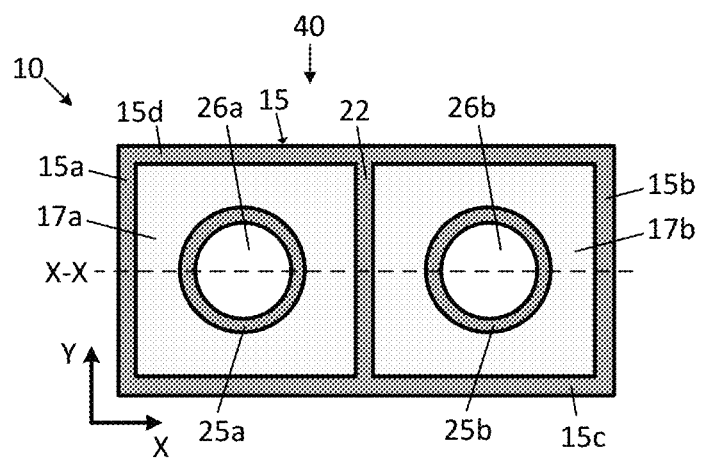
FIG. 2B is a diagrammatical overhead view of the fully assembled photonic device of FIG. 1.
Figure 2A:
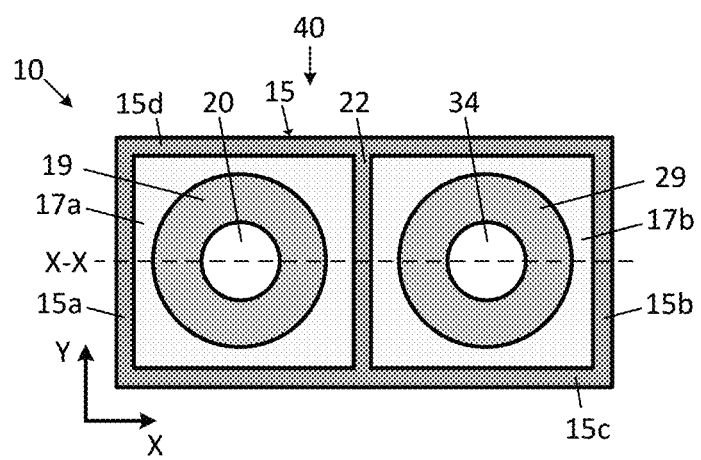
FIG. 2A is a diagrammatical overhead view of the cap of FIG. 1 is a disassembled state.

Now described with reference to FIGS. 1 and 2A is a photonic device 10. With initial reference to the cross section of FIG. 1, the photonic device 10 may be a time of flight (TOF) sensor or a light detection and ranging (LIDAR) sensor, and includes a printed circuit board (PCB) 11 having a light sensor 13 (e.g., a reflected light detector) mounted thereto via a non-conductive adhesive 12, and a light emitter 33 (e.g., a laser emitter) mounted thereto via a metal pad 32 which forms either the anode or the cathode connection, with the other connection being formed via wire bonds. Note, however, there are many bonding technologies which could be used to attach the light sensor 13 and light emitter 33 to the PCB 11, and the examples given in this paragraph are non-limiting.

Also, a reference detector 52 is mounted to the PCB via non-conductive adhesive 51, and serves to detect the time at which the light emitter 33 emits a pulse so that ranging can be performed.

A cap 40 holds a receiver lens 20 over the PCB 11 such that the receiver lens 20 is properly aligned with the light sensor 13, and holds a transmitter lens 34 over the PCB 11 such that the transmitter lens 34 is properly aligned with the light emitter 33. The cap 40 is affixed to the PCB 11 by adhesive beads 14 and 21 that lie on the PCB 11 in a shape generally matching the shape of the bottom portions of the cap 40 that are affixed to the PCB 11. The receiver lens 20 and transmitter lens 34 may both be polycarbonate lenses. The adhesive may be epoxy. The receiver lens 20 and transmitter lens 34 may take any suitable shape, for example being circular or rectangular.

Do note that the cross sectional view of the photonic device 10 shown in FIG. 1 is a cross section of the cap 40 taken along line X-X of FIG. 2A. FIG. 2A is a top plan view of the photonic device 10 of FIG. 1 as assembled, while FIG. 2B is a top plan view of the cap 40b with retention structures 19 and 29 (described below) removed.

The shape of the cap 40 is best shown in FIG. 2B. The cap 40 (and PCB, although not illustrated) is rectangular in shape, having an outer peripheral wall 15 defined by opposite sides 15c, 15d and opposite ends 15a, 15b. The sides 15c, 15d are longer in dimension along their longitudinal axes than the ends 15a, 15b are along their longitudinal axes; stated differently, the sides 15c, 15d extend longer along the X-axis of the photonic device 10 than the ends 15a, 15b extend along the Y-axis of the photonic device 10. An inner wall 22 extending from side 15c to side 15d divides the outer peripheral wall 15 into two rectangular shapes.

A shelf 17a extends generally perpendicularly from respective portions of the side 15a, ends 15c and 15d, and the inner wall 22. The shelf 17a has an opening 26a defined therein that is generally aligned with the light sensor 13 when the shelf cap 40 is attached to the PCB 11. A support 25a extends generally perpendicularly from a distal end of the shelf 17a, in the positive Z-direction away from the PCB 11, and surrounds the opening 26a. When viewed from a top down perspective, the opening 26a and the support 25a may be annular or rectangular in shape, matched to the shape of the receiver lens 20. In some instances, the opening 26a and the support 25a may instead be polygonal in shape. When viewed from a top down perspective, the inner perimeter of the shelf 17a, delimited by the support 25a, follows the opening 26a in shape, while the outer perimeter of the shelf 17a, delimited by respective portions of the side 15a, ends 15c and 15d, and the inner wall 22, is rectangular in shape.

A shelf 17b extends generally perpendicularly from respective portions of the side 15b, ends 15c and 15d, and the inner wall 22. The shelf 17b has an opening 26b defined therein that is generally aligned with the light emitter 33 when the shelf cap 40 is attached to the PCB 11. A support 25b extends generally perpendicularly from a distal end of the shelf 17b, in the positive Z-direction away from the PCB 11, and surrounds the opening 26b. When viewed from a top down perspective, the opening 26b and the support 25b may be annular or rectangular in shape, matched to the shape of the transmitter lens 34. In some instances, the opening 26b and the support 25b may instead be polygonal in shape When viewed from a top down perspective, the inner perimeter of the shelf 17b, delimited by the support 25b, follows the opening 26b in shape, while the outer perimeter of the shelf 17b, delimited by respective portions of the side 15b, ends 15c and 15d, and the inner wall 22, is rectangular in shape. The receiver lens 20 is mechanically captured inside of a retention structure 19 (formed by a rectangular shaped sidewall 19a with a ceiling 19b extending thereacross, with an opening 19c being defined in the ceiling 19b). The sidewall 19a of the retention structure 19 is affixed to the shelf 17a by adhesive bead 18a. This mechanically captures the receiver lens 20 within the cap 40 between the retention structure 19 and the support 25a, and therefore securely locates and constrains the receiver lens without the application of adhesive thereto.

The transmitter lens 34 is mechanically captured inside of a retention structure 29 (formed by a rectangular shaped sidewall 29a with a ceiling 29b extending thereacross, with an opening 29c being defined in the ceiling 29b). The sidewall 29a of the retention structure 29 is affixed to the shelf 17b by adhesive bead 18b. This mechanically captures the transmitter lens 34 within the cap 40 between the retention structure 29 and the support 25b, and therefore securely locates and constrains the receiver lens without the application of adhesive thereto.

In the application shown, a receiver light filter 24a is mechanically connected to the underside of the shelf 17a by adhesive bead 21a. Similarly, a transmitter light filter 24b is mechanically connected to the underside of the shelf 17b by adhesive bead 21b. Note that the receiver light filter 24a and the transmitter light filter 24b are formed of glass, and therefore the adhesive beads 21a and 21b are able to properly adhere to the receiver light filter 24a and the transmitter light filter 24b.

However, in other applications, instead of being integrated into the glass filters 24a and 24b, the filtering function may instead be integrated onto the receiver lens 20 and transmitter lens 34, or integrated into the light sensor 13 and light emitter 33.

Formation of the photonic device 10 is now described. The light sensor 13 is mounted via a non-conductive adhesive 12 to the PCB 11. The light emitter 33 is glued with a conductive glue to the metal pad 32 on the PCB 11. The light sensor 13 and light emitter are wirebonded to complete their electrical connections with PCB 11. The cap 40 is placed upside down so that the supports 25a and 25b extend downward (the negative Z-direction in the illustrated cross section), and the receiver light filter 24a and transmitter light filter 24b are then glued to the undersides of the shelves 17a and 17b. The cap 40 is then flipped back over, and then glued in place on the PCB 11 by the adhesive masses 14a, 14b, and 21.

The receiver lens 20 is press fit into the retention structure 19, and the retention structure 19 is then placed onto the shelf 17a, and glued in place by the adhesive bead 18a. Notice that the shelf 17a defines an annulus (or rectangular shape or polygonal shape) between the support 25a and respective portions of the end 15a, sides 15c and 15d, and inner wall 22, said annulus being sized and shaped to permit adjustment of the retention structure 19 (with receiver lens 20 affixed therein) in the X-Y direction so as to align the optical axis of the lens 20 with the optical axis of the sensing portion of the light sensor 13, thereby allowing precise horizontal adjustment of the receiver lens 20 with respect to the light sensor 13. The transmitter lens 34 is press fit into the retention structure 29, and the retention structure 29 is then placed onto the shelf 17b, and glued in place by the adhesive bead 18b. Notice that the shelf 17b defines an annulus (or rectangular shape or polygonal shape) between the support 25b and respective portions of the end 15b, sides 15c and 15d, and inner wall 22, said annulus being sized and shaped to permit adjustment of the retention structure 29 (with transmitter lens 34 affixed therein) in the X-Y direction so as to align the optical axis of the lens 34 with the optical axis of the emitting portion of the light emitter 33, thereby allowing precise horizontal adjustment of the transmitter lens 34 with respect to the light sensor 13.

Since the receiver lens 20 and transmitter lens 34 are in physical contact with the supports 25a and 25b, axial alignment along the Z-direction is maintained as desired, provided that the supports 25a and 25b are formed with sufficient tolerances.

Figure 1A:
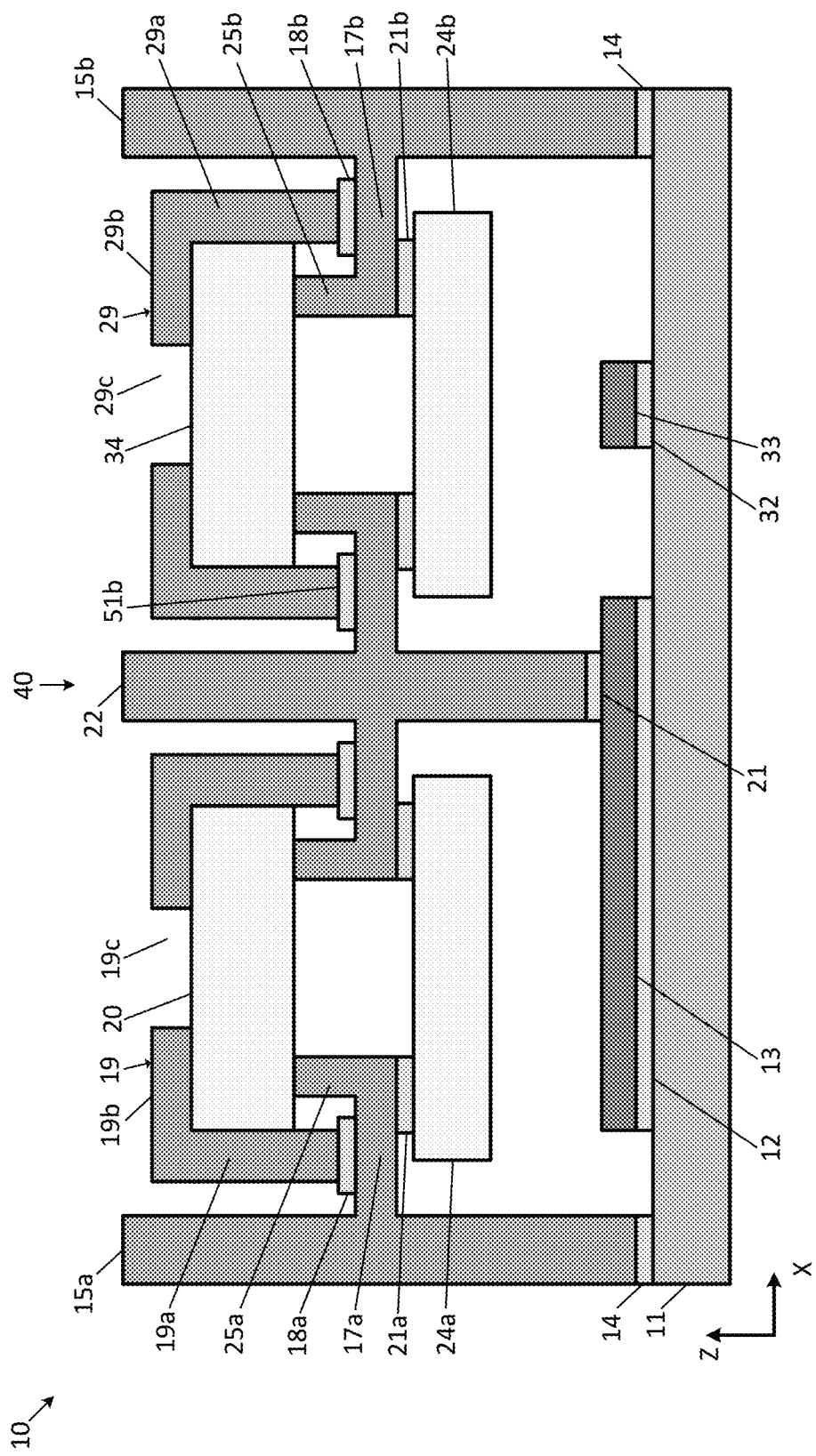
FIG. 1A a diagrammatical view of a cross section of a variant of the photonic device of FIG. 1.

As an alternative to the reference detector 52 being used, instead, a portion of the light sensor 13 may extend under or through the sidewall to perform the reference detection function, as shown in FIG. 1A.

Figure 3:
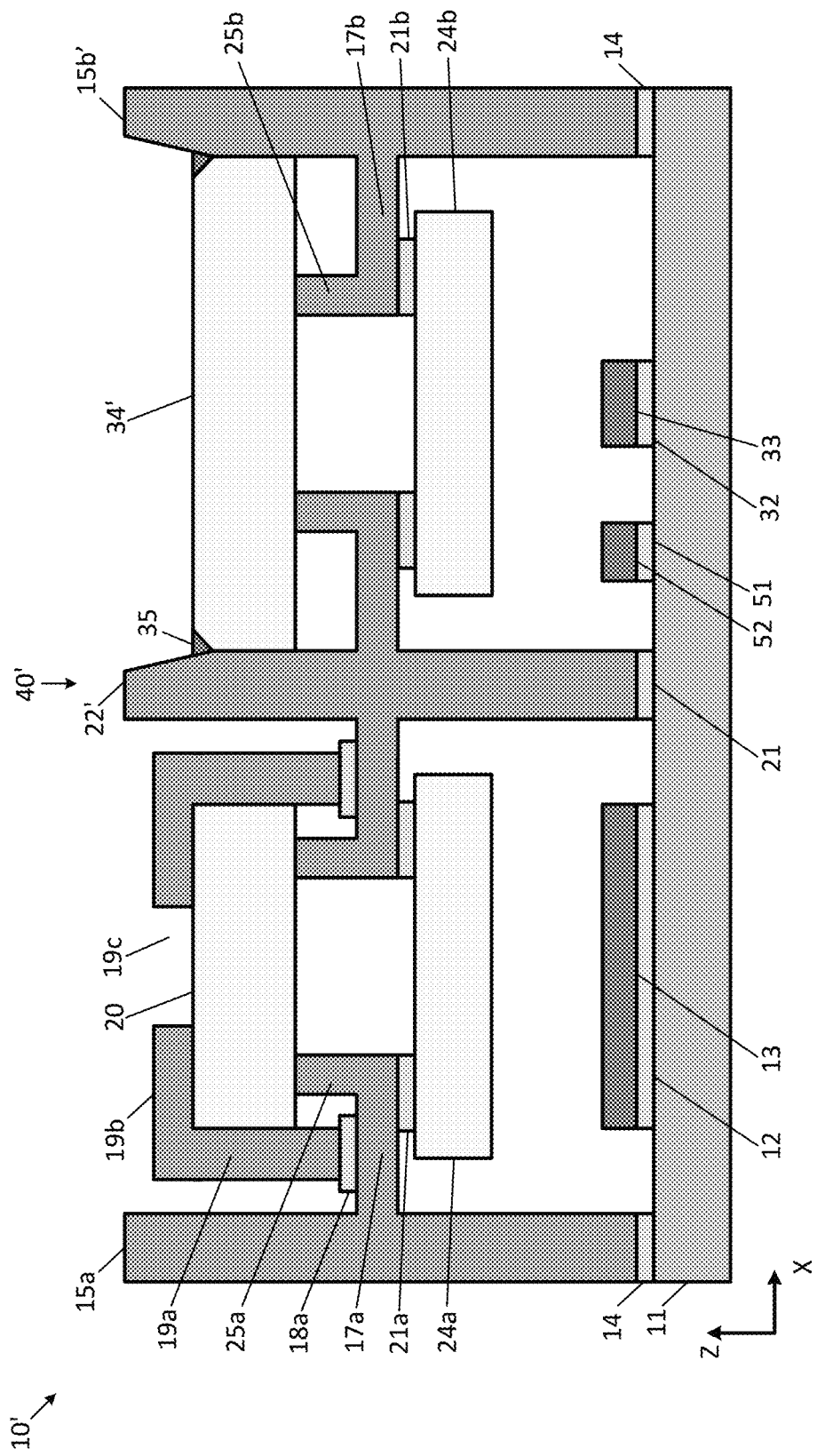
FIG. 3 is a diagrammatical view of a cross section of another photonic device disclosed herein, in which the lenses are mechanically captured within the cap, with one lens being mechanically captured between a primary cap structure and a secondary capture structure, and another lens being mechanically captured between a primary cap structure and a hardened epoxy layer.

Another design for a photonic device 10' is now described with reference to FIG. 3. The difference here over the photonic device 10 of FIG. 1 is that one of the lenses (here, the transmitter lens 34', but could be the receiver lens 20 instead) is press fit directly within the retention structure 29, and mechanically constrained in place by an applied and hardened substance 35. Note that there is a chamfer formed along the top edge of the transmitter lens 34', and that the sides of the interior wall 22', end 15b', and sides 15c' and 15d' (both of which are not shown in FIG. 3) are trapezoidally shaped toward the distal ends thereof in a way that eases insertion of the transmitter lens 34' to form a press fit.

Formation of this photonic device 10' is now described. The light sensor 13 is mounted via a non-conductive adhesive 12 to the PCB 11, and the light emitter 33 is glued with a conductive glue to the metal pad 32 on the PCB 11. The cap 40' is placed upside down so that the supports 25a and 25b extend downward (the negative Z-direction in the illustrated cross section), and the receiver light filter 24a and transmitter light filter 24b are then glued to the undersides of the shelves 17a and 17b. The cap 40' is then flipped back over, and the transmitter lens 34' is press fit between the interior wall 22', end 15b', and sides 15c' and 15d' (both of which are not shown in FIG. 3). A substance 35, such as epoxy, is then deposited or applied between the chamfer of the transmitter lend 34' and the end 15b', sides 15c' and 15d', and interior wall 22', and allowed to harden. The cap 40' is then aligned over the PCB 11 such that the desired axial alignment of the transmitter lens 34' with the light emitter 33' is reached, and glued in place on the PCB 11 by the adhesive beads 14 and 21.

The receiver lens 20 is press fit into the retention structure 19, and the retention structure 19 is then placed onto the shelf 17a, and glued in place by the adhesive bead 18a. Notice that the shelf 17a defines an annulus between the support 25a and respective portions of the end 15a, sides 15c and 15d, and inner wall 22, said annulus being sized and shaped to permit adjustment of the retention structure 19 (with receiver lens 20 affixed therein) in the X-Y direction so as to align the optical axis of the lens 20 with the optical axis of the sensing portion of the light sensor 13, thereby allowing precise horizontal adjustment of the receiver lens 20 with respect to the light sensor 13.

As stated, appreciate that instead of the transmitter lens 34' being press fit into the cap 40' and mechanically constrained by the hardened mass 35, and the receiver lens 20 being mechanically constrained within the retention structure 19, the receiver lens 20 may be press fit into the cap 40' and mechanically constrained by a hardened mass, and the transmitter lens 34 may be mechanically constrained within a retention structure 29.

As described herein, substances used for gluing, as well as the hardened mass, may be epoxy.

Figure 3A:
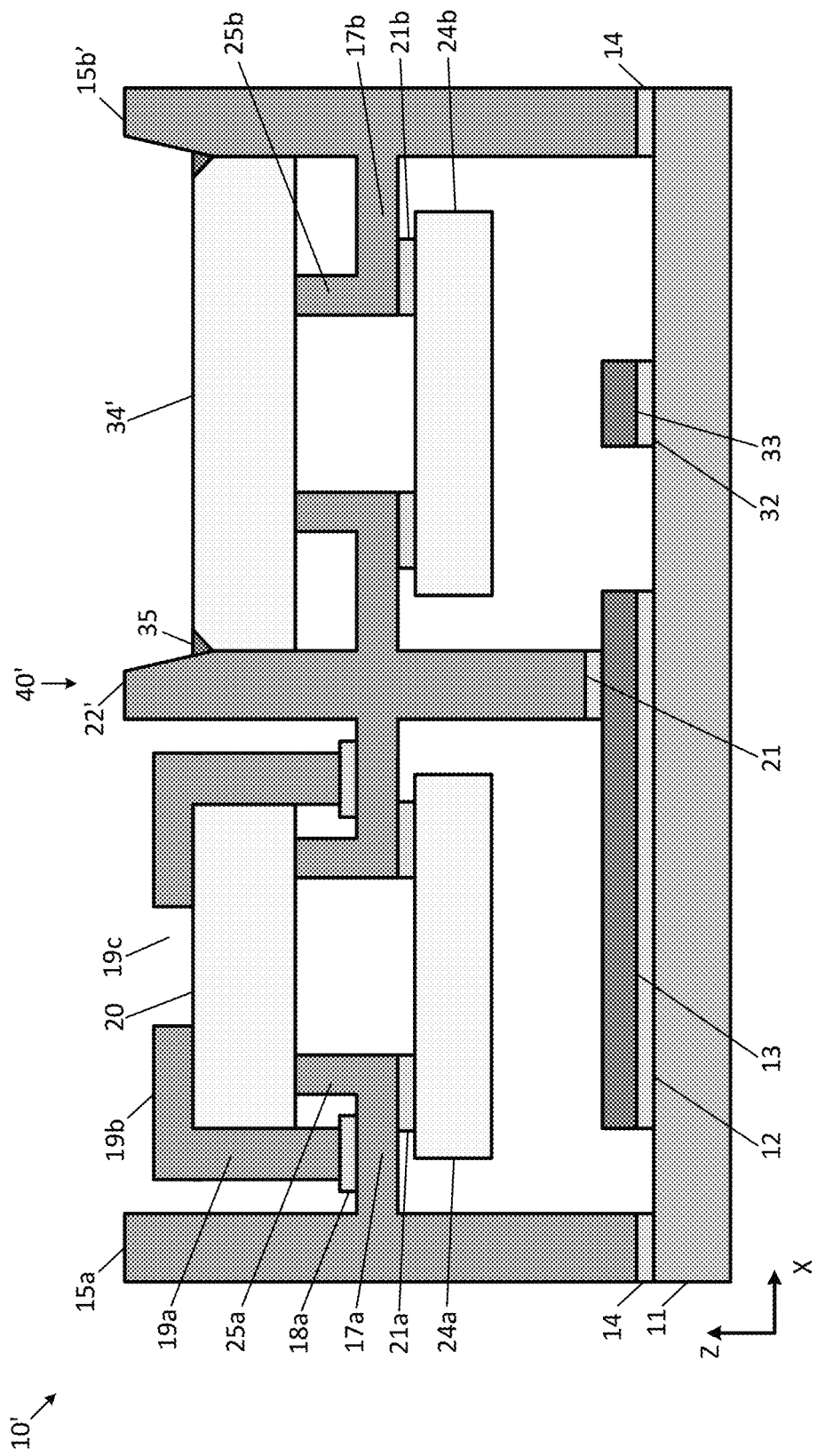
FIG. 3A is a diagrammatical view of a cross section of a variant of the photonic device of FIG. 3.

As an alternative to the reference detector 52 being used, instead, a portion of the light sensor 13 may extend under or through the sidewall to perform the reference detection function, as shown in FIG. 3A. This does not otherwise alter the technique for forming the photonic device 10'.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A photonic device, comprising:
a printed circuit board (PCB) having an integrated circuit mounted thereon; and
a cap mounted to the PCB and carrying a lens positioned over the integrated circuit, the cap comprising:
an outer wall mounted to the PCB, extending upwardly from the PCB, and surrounding at least a portion of the integrated circuit, the outer wall being spaced apart from the lens;
a first retention structure extending inwardly from the outer wall and across the integrated circuit, the first retention structure having a hole defined therein, the hole being surrounded by a support wall that makes physical contact with a bottom face of the lens, the bottom face of the lens facing the PCB; and
a second retention structure having a hole defined in a ceiling thereof that makes physical contact with a top face of the lens, the top face of the lens being opposite the bottom face, the second retention structure being affixed within the first retention structure such that the hole in the second retention structure is axially aligned with the hole in the first retention structure and such that the lens is mechanically constrained within the cap between the support wall of the first retention structure and the ceiling of the second retention structure, with light being transmissible therethrough via the hole defined in the second retention structure, the mechanical constraint of the lens being such to align the lens with the integrated circuit.

2. The photonic device of claim 1, wherein the outer wall and first retention structure are integrally formed as a monolithic unit.

3. The photonic device of claim 1, wherein the first retention structure comprises a shelf extending orthogonally from respective parts of the outer wall and a support extending from a distal end of the shelf and orthogonally thereto in a direction away from the PCB; and wherein the lens is mechanically constrained between a bottom face of the second retention structure and the support of the first retention structure.

4. The photonic device of claim 3, wherein the second retention structure comprises a shaped wall extending parallel to the outer wall, with a ceiling extending across the shaped wall, the ceiling having the hole defined therein.

5. The photonic device of claim 1, wherein the outer wall surrounds three sides of the integrated circuit; wherein the cap further comprises an additional wall extending between two portions of the outer wall such that the additional wall extends along a fourth side of the integrated circuit; wherein a first portion of the first retention structure extends from the outer wall and across the integrated circuit; and wherein a second portion of the first retention structure extends from the additional wall and across the integrated circuit.

6. The photonic device of claim 5, wherein the first and second portions of the first retention structure define a shelf, and a support extending from a distal end of the shelf and orthogonally thereto in a direction away from the PCB; wherein the lens is mechanically constrained between a bottom face of the second retention structure and the support of the first retention structure.

7. The photonic device of claim 6, wherein the PCB has an additional integrated circuit mounted thereon; wherein the outer wall surrounds three sides of the additional integrated circuit; wherein the additional wall extends between two portion of the outer wall such that the additional wall extends along a fourth side of the additional integrated circuit; wherein a third portion of the first retention structure extends outwardly from the outer wall and across the additional integrated circuit; and wherein a fourth portion of the first retention structure extends outwardly from the additional wall and across the additional integrated circuit.

8. The photonic device of claim 7, wherein the third and fourth portions of the first retention structure define an additional shelf, and an additional support extending from a distal end of the additional shelf and orthogonally thereto in a direction away from the PCB; wherein an additional lens is mechanically constrained between a bottom face of the second retention structure and the additional support of the first retention structure.

9. The photonic device of claim 8, further comprising a first filter glued to a bottom face of the shelf, and a second filter glued to a bottom face of the additional shelf.

10. The photonic device of claim 7, wherein the third and fourth portions of the first retention structure define an additional shelf, and an additional support extending from a distal end of the additional shelf and orthogonally thereto in a direction away from the PCB; and further comprising an additional lens sized so as to be press fit and mechanically constrained between the outer wall and the additional wall, supported by the additional support of the first retention structure.

11. The photonic device of claim 10, wherein the cap further comprises a hardened mass in contact with a perimeter of the additional lens and with the outer wall and additional wall.

12. The photonic device of claim 11, wherein the additional lens has a chamfer defined therein; and wherein the hardened mass is in contact with a surface of the chamfer.

13. The photonic device of claim 12, wherein portions of the outer wall and additional wall adjacent the additional lens are trapezoidally shaped at distal ends thereof.

14. The photonic device of claim 1, further comprising a filter glued to a bottom face of the first retention structure.

15. The photonic device of claim 14, wherein the filter is formed of glass; and wherein the lens is formed of polycarbonate.

16. A photonic device, comprising:
an integrated circuit; and
a cap mounted over the integrated circuit, the cap comprising:
a lens mechanically constrained within the cap;

an outer wall surrounding at least a portion of the integrated circuit, the outer wall being spaced apart from the lens;

a first retention structure extending inwardly from the outer wall and across the integrated circuit, the first retention structure having a hole defined therein, the hole being surrounded by a support wall that makes physical contact with a bottom face of the lens, the bottom face of the lens facing the integrated circuit;

a second retention structure having a hole defined in a ceiling thereof that makes physical contact with a top face of the lens, the top face of the lens being opposite the bottom face, the second retention structure being affixed within the first retention structure such that the hole in the second retention structure is axially aligned with the hole in the first retention structure; and the lens being mechanically constrained within the cap between the support wall of the first retention structure and the ceiling of the second retention structure, with light being transmissible therethrough via the hole defined in the second retention structure, the mechanical constraint of the lens being such to align the lens with the integrated circuit.

17. The photonic device of claim 16, further comprising a filter glued to a bottom face of the first retention structure.

18. The photonic device of claim 17, wherein the filter is formed of glass; and wherein the lens is formed of polycarbonate.

19. The photonic device of claim 16, wherein the outer wall and first retention structure are an integral monolithic unit.

20. The photonic device of claim 16, wherein the first retention structure comprises a shelf extending orthogonally from respective parts of the outer wall and a support extending orthogonally from a distal end of the shelf; and wherein the lens is mechanically constrained between a bottom face of the second retention structure and the support of the first retention structure.

* * * * *